COMPLEMENTARY FIELD-EFFECT TRANSISTORS ON COMMON SUBSTRATE BY MULTIPLE EPITAXY TECHNIQUES

Filed May 4, 1967 2 Sheets-Sheet 1

Inventor
ROGER CULLIS
By A. L. Lessler
Attorney

Inventor
ROGER CULLIS
By A. L. [signature]
Attorney

United States Patent Office 3,518,509

Patented June 30, 1970

3,518,509

COMPLEMENTARY FIELD-EFFECT TRANSISTORS ON COMMON SUBSTRATE BY MULTIPLE EPITAXY TECHNIQUES

Roger Cullis, Meopham, Kent, England, assignor to International Standard Electric Corporation, New York, N.Y., a corporation of Delaware Filed May 4, 1967, Ser. No. 636,161

Claims priority, application Great Britain, June 17, 1966, 27,106/66

Int. Cl. H01l *11/14*

U.S. Cl. 317—235 4 Claims

ABSTRACT OF THE DISCLOSURE

A semiconductor structure including insulated-gate field-effect transistors of complementary types in a single semiconductor substrate, wherein the length of the channel of each transistor is determined by the thickness of an epitaxial layer. This is accomplished by forming a plurality of epitaxial layers of different conductivity types on the substrate, forming recesses exposing edges of the epitaxial layers, and disposing insulating material on said edges and gate electrodes on the insulating material. In each transistor so formed one epitaxial layer serves as either the source or drain region while an adjacent layer serves to provide the channel region.

RELATED APPLICATIONS

Figure 1A:
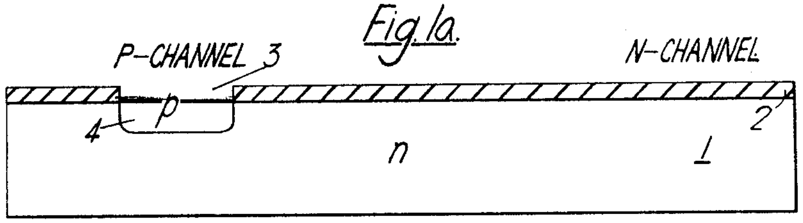
Figure 1B:
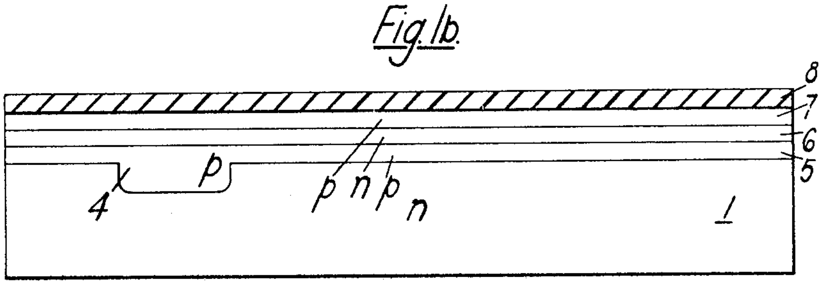
Figure 1C:
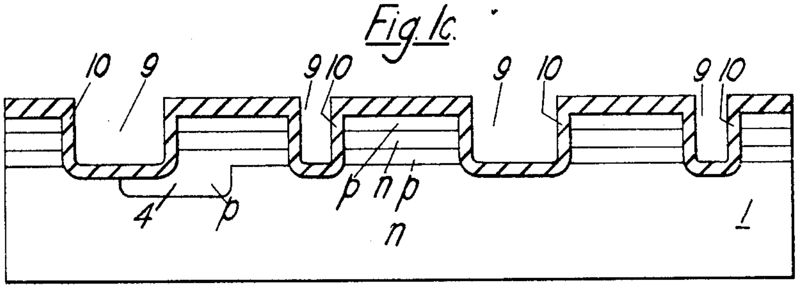
Figure 1D:
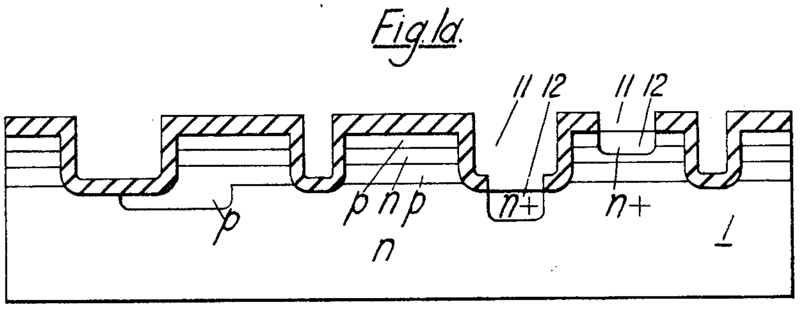

The subject matter of this invention is generally related to that disclosed in U.S. pat. application Ser. No. 523,371, filed Jan. 27, 1966 and assigned to the assignee of the instant application.

BACKGROUND OF THE INVENTION

This invention relates to insulated-gate field-effect transistors and methods of manufacture thereof.

Insulated-gate field-effect transistors rely for their operation on conduction of charge-carriers between two heavily doped regions of one conductivity type via a channel of like conductivity type through a region of very low or opposite conductivity. The conductance of the channel, which may be induced one, is modulated by a field created in an adjacent dielectric layer by a metallic electrode. In the manufacture of integrated circuits using insulated-gate field-effect transistors, particular economies can be achieved by employing complementary devices, i.e., both p-channel and n-channel devices. On way that this has been realised is to form the devices in material of either intrinsic or very low extrinsic conductivity. However, due to the low number of uncompensated impurities in the substrate, such devices are subject to the influence of deleterious phenomena such as migratory ions on the semiconductor surface, resulting in instability of the electrical characteristics of such devices.

The present invention overcomes this problem of instability by providing separate regions of unlike conductivity types in which the channels of complementary devices may be formed, by making use of the technology of multiple epitaxy.

SUMMARY

The present invention provides a slice of semiconductor material including at least one pair of complementary insulated-gate field-effect transistors having channels the lengths of which are determined by the thickness of epitaxial layers of unlike conductivity types separating their respective source and drain regions.

The present invention further provides a slice of semiconductor material wherein a part of the epitaxial layer separating the source and drain regions of one of the pair of complementary insulated-gate field-effect transistors serves as either the source or the drain region for the other of said pair and vice versa.

IN THE DRAWING

Figure 1E:
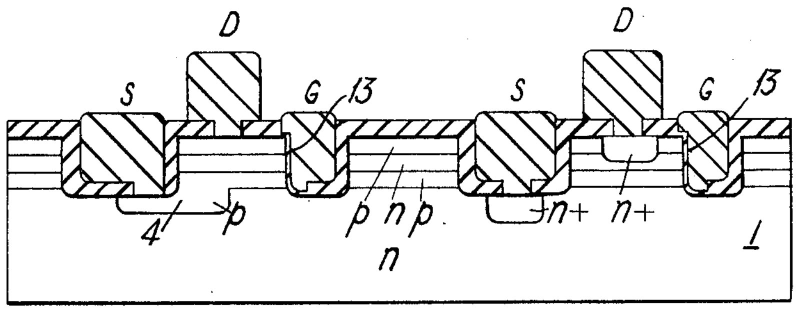
Figure 2:
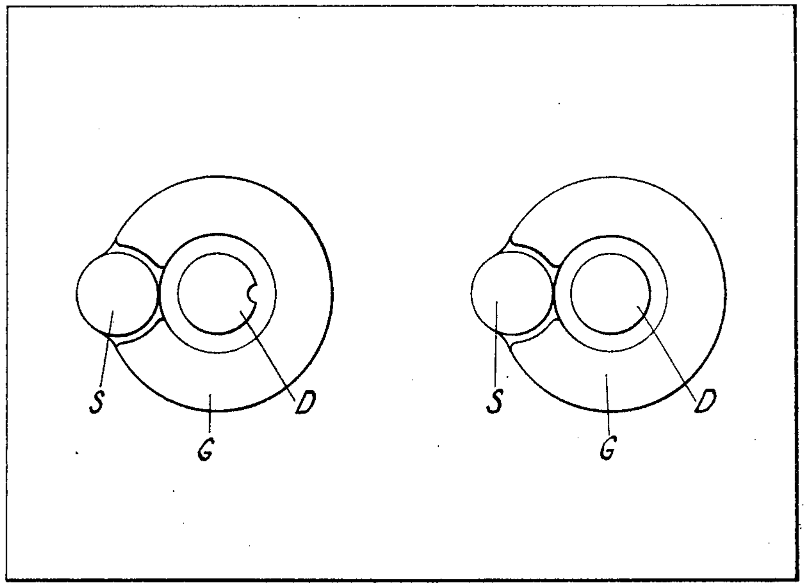

FIGS. 1*a* to 1*e* show in cross-section successive stages in a fabrication of complementary devices in the same slice of semiconductor material according to the invention; and FIG. 2 shows a plan view of the devices of FIG. 1*e*.

DETAILED DESCRIPTION

Referring the drawings, a slice 1 of n-type silicon 2.5 cm. in diameter and 250 microns thick having a resistivity of 2-ohm-cm. is heated in an oxidizing atmosphere and an oxide layer 2 thereby formed on its surface. Using wel-known photolithographic techniques, a window 3 is etched through the oxide and boron is diffused into the silicon to form a p-type region 4. Sufficient boron is introduced into the slice region 4 to overcome the background (donor) impurities, but the surface concentration of boron is chosen so that the boron will not completely penetrate the thickness of the p-type which is subsequently formed over the p-type region 4. Alternatively, a slower diffusing acceptor impurity such as indium could be used to form the p-type region 4.

The oxide layer 2 is then removed and the slice is placed in an epitaxial reactor and heated to 1200° C. A silicon layer 5 is deposited on the surface of the slice by reaction of a mixture of hydrogen and silicon tetrachloride gases in the vicinity of said surface. Initially p-type epitaxial material is grown, the gaseous mixture being doped with diborane. When epitaxial layer is 0.5 microns thick, phosphine is introduced into the reactor in place of diborane and an n-type epitaxial layer 6 is now deposited. After the n-type layer 6 is 0.5 microns thick, the dopant is once more changed to diborane, and a further p-type epitaxial layer 7 0.5 microns thick is grown. Finally, carbon dioxide is introduced into the reactor and a layer of silica 8 is grown on the surface of the slice.

The slice is cooled and removed from the reactor. Windows are etched photolithographically through the oxide layer and the slice is returned to the reactor and heated once more, to a temperature of 1200° C. A mixture of hydrogen chloride and hydrogen gases is passed over the slice surface to etch holes 9 through the epitaxial layers 5 to 7, exposing the surface of the substrate 1 and the p-type region 4. The atmosphere in the reactor is then changed to a mixture of carbon dioxide, silicon tetrachloride and hydrogen, and a layer of silica 10 deposited in the holes 9.

The slice is removed once more from the reactor and further windows 11 etched in the surface oxide layer. Phosphorus is diffused through these windows to form n+ source and drain regions 12 for the n-channel device. The depth of diffusion must be sufficient for the n+ region adjacent the upper surface to penetrate the outer p-type layer 7, but not sufficient for said n+ region to contact the substrate 1.

The silica layer is then removed from part of the walls of some of the holes through the epitaxial layers and a further thin oxide layer 13 grown on the thus exposed silicon.

Contact windows are then etched through the oxide layer and aluminum contacts on the order of 2 microns thick are deposited to form source (S), drain (D) and gate (G) electrodes of both p-channel and n-channel devices. The slice is heated to 500° C. during the deposition to provide good adhesion and electrical contact.

Modifications may be made to the above processing without deviating from the scope of the invention. For example, a semiconductor other than silicon may be used. In such a case it will, in general, be necessary to use deposited insulating layers since the grown oxides will usually be unstable. Deposited insulating layers may also be used with silicon throughout instead of grown layers and it has, in fact, been found that silicon nitride has excellent properties when used as the gate dielectric.

Although for simplicity the fabrication of two separate devices has been described, the invention is of greatest advantage in integrated circuits where devices are interconnected. In this case some variation of device geometry is necessary to allow room for the interconnection patterns. It may also be necessary to isolate devices from one another, for example by provision of a fourth epitaxial layer and isolation diffusion.

Source and drain regions may be interchanged, and the various local diffusions may also serve as interconnections between different parts of a circuit. In fact, it is not necessary to employ diffusion to form the localised regions; for example a combination of etching and local epitaxy may achieve the same result.

While the principles of the invention have been described above in connection with specific embodiments, and particular modifications thereof, it is to be clearly understood that this description may only by way of example and not as a limitation on the scope of the invention.

I claim:

1. Semiconductor apparatus including a semiconductor body having a major surface, said body including at least one pair of complementary insulated-gate field-effect transistors, comprising:

- a first layer of one conductivity type on said major surface;
- a second layer of opposite conductivity type on said first layer;
- a third layer of said one conductivity type on said second layer;
- said layers forming a laminate having a plurality of operating portions;
- first source and drain electrodes coupled to the respective first and third layers of a selected one of said operating portions;
- second drain and source electrodes coupled to the respective second layer and a part of said body adjacent the first layer of another one of said operating portions, said body part having said opposite conductivity type;

- a first region of said one conductivity type formed within said major surface of said body, said first region couples said first source electrode to said first layer of said selected portion;
- a second region of said opposite conductivity type extending within said other selected portion from the surface of said third layer to and within said second layer, said second region couples said second drain electrode to said second layer;
- said body having a first recess structure adjacent said major surface exposing an edge of said second layer of said selected portion;
- said body having a second recess structure adjacent said major surface exposing an edge of said first layer of said other portion;
- first and second insulating films overlying said second layer edge and said first layer edge respectively; and
- first and second gate electrodes contacting said first and second insulating films respectively, whereby said first electrode and first insulating film cooperate with said selected operating portion to provide an insulated-gate field-effect transistor having a first channel length which is determined by the thickness of said second layer edge, and said second electrode and second insulating film cooperating with said other operating portion to provide a complementary insulated-gate field-effect transistor having a second channel length which is determined by the thickness of said first layer edge.

2. Semiconductor apparatus according to claim 1 wherein said semiconductor body is silicon.

3. Semiconductor apparatus according to claim 2 wherein said silicon is of n-type conductivity.

4. Semiconductor apparatus according to claim 1 wherein said first and second insulaing layers comprise silicon nitride.

References Cited

UNITED STATES PATENTS

| | | | |
|---|---|---|---|
| 2,899,344 | 8/1959 | Atalla et al. | 148—1.5 |
| 3,340,598 | 9/1967 | Hatcher | 29—571 |
| 3,339,086 | 8/1967 | Shockley | 307—88.5 |
| 3,356,858 | 12/1967 | Wanlass | 307—88.5 |
| 3,412,297 | 11/1968 | Amlinger | 317—235 |

JOHN W. HUCKERT, Primary Examiner

B. ESTRIN, Assistant Examiner

U.S. Cl. X.R.

317—234